United States Patent [19]
Sinclair

[11] 3,993,918
[45] Nov. 23, 1976

[54] INTEGRATED CIRCUITS

[75] Inventor: Alan Welsh Sinclair, Sawston, England

[73] Assignee: U.S. Philips Corporation, New York, N.Y.

[22] Filed: Dec. 12, 1974

[21] Appl. No.: 532,259

[30] Foreign Application Priority Data
Dec. 21, 1973 United Kingdom............. 59462/73

[52] U.S. Cl............................ 307/279; 307/221 R; 307/225 R; 307/288; 307/291; 307/303; 357/36; 357/44; 357/46; 357/48
[51] Int. Cl.² ................. H03K 3/286; H03K 23/08; G11C 19/28
[58] Field of Search .......... 307/289, 291, 303, 279, 307/288, 313, 36, 48, 221 R, 225 R; 357/34, 35, 40, 44, 46, 51

[56] References Cited
UNITED STATES PATENTS

| | | | |
|---|---|---|---|
| 3,440,449 | 4/1969 | Priel et al. ...................... | 307/289 X |
| 3,591,856 | 7/1971 | Kalb............................... | 307/291 X |

Primary Examiner—John Zazworsky
Attorney, Agent, or Firm—Frank R. Trifari; Ronald L. Drumheller

[57] ABSTRACT

A master/slave bistable arrangement which operates on current levels rather than voltage levels and with a single input of clock pulses. There are different bias current levels which are advantageously supplied by multi-layer current injection structures in integrated form.

23 Claims, 13 Drawing Figures

INTEGRATED CIRCUITS

This invention relates to electrical circuits, particularly but not exclusively integrated circuits, comprising at least one master/slave bistable arrangement constructed for operation with a single input of clock pulses.

Integrated circuits are known comprising a plurality of semiconductor circuit elements arranged in a common semiconductor body and adjoining one side of the body, at least one multi-layer current injection structure being present for supplying bias current to a zone of a circuit element. Such integrated circuits are described in British Pat. Application No. 23699/72 and for a further description of the mechanism by which such current injection integrated circuits operate and the advantages inherent in the structures reference is invited to "Philips Technical Review", Volume 33, 1973, No. 3, pages 76 to 85.

With conventional current injection integrated circuits a problem arises when it is desired to construct a master/slave bistable arrangement operating on voltage levels without recourse to separate clock pulse inputs for the master and slave. The voltage levels within a current injection integrated circuit normally lie within the range of bias voltage applied to the current injector. This is normally 1 volt or less. Therefore with current injection there is not a sufficient voltage change to inhibit the slave and to enable the master in the normal manner.

The present invention is based on the recognition that a novel master/slave bistable arrangement operating on current levels, as opposed to voltage levels in known circuits such as Transistor-Transistor Logic (TTL) integrated circuits, having a single input of clock pulses can be advantageously provided by suitable arrangement of various bias currents and, although such a circuit can be constructed in a conventional manner either using discrete components or conventional integrated circuit techniques, considerable advantages arise when using current injection techniques with suitable choice of the configuration and situation of multi-layer current injection structures and the zones of circuit elements to be biased and utilising the feature that bias currents of different magnitudes can be supplied by one or more multi-layer current injection structures.

According to the invention an electrical circuit comprises at least one master/slave bistable arrangement constructed for operation with a single input of clock pulses, the master bistable including a cross-coupled pair of transistors and the slave bistable including a cross-coupled pair of transistors, means being present for supplying at least the cross-coupled pair of transistors in the slave with primary bias current of a certain magnitude from a fixed current source, the clock pulse input to the circuit being effective in determining the primary bias current supplied to the cross-coupled pair of transistors in the master at a normal level and a reduced level during clock periods, further means being present to provide from the fixed current source sources of secondary bias current of smaller magnitude for supply to the cross-coupled pair of transistors, or transistors connected thereto, in the master or a further master of a preceding or succeeding similar master/slave arrangement present in the circuit, said sources of secondary bias current having no effect on the state of said master or further master when the bias current supplied to the cross-coupled pair of transistors in said master or said further master is at the normal level, said sources of secondary bias current being effective when the primary bias current supplied to the cross-coupled pair of transistors of said master or further master is at the lower level to pre-condition the state of said master or further master and hence determine its condition when the said primary bias current returns or is returned to the normal level.

This circuit thus comprises a master/slave bistable arrangement operating on current levels and with a single input of clock pulses. Particularly when constructed in an integrated circuit form using current injection techniques the said configuration may give rise to significant advantages. It is thus possible using current injection techniques to form a static shift register with static transfer.

Thus, in a preferred form the electrical circuit is formed as an integrated circuit, said integrated circuit comprising a semiconductor body in which the transistors are present and adjoin one side of the body a plurality of multi-layer current injection structures adjoining the said one side of the body and provided for supplying primary bias current to the cross-coupled pairs of transistors in the master/slave bistable arrangement and for supplying secondary bias current in the form of reinjected bias current to the cross-coupled pair of transistors, or transistors connected thereto, in the master or a further master of a preceding or succeeding similar master/slave bistable arrangement, the said reinjected secondary bias current being of smaller magnitude than the primary bias current supplied to the relevant transistor of said master or futher master.

Such an integrated circuit has various advantages as will be apparent from the description later herein of various embodiments. In particular the employment of the multi-layer current injection structures to provide primary bias current and secondary reinjected bias current of smaller magnitude enables a master/slave bistable arrangement operating on current levels with a single clock pulse input to be obtained in a relatively simple manner and in a relatively compact form. The single input of clock pulses may be applied in various different ways depending on the particular configuration of the arrangement and this will be described subsequently in respect of different specific forms of the arrangement.

In a first form of the integrated circuit in accordance with the invention the multi-layer current injection structures which supply primary bias current to the transistors in the slave each comprise five successively arranged regions of alternating conductivity type adjoining the one side of the semiconductor body, the third regions constituting the base zones of the cross-coupled pair of transistors in the slave and the fifth regions constituting the base zones of the transistors to be supplied with reinjected bias current, and in each of said structures the first region forming an injector region having a connection for applying one polarity of a source of bias current and the second region having a connection for the other polarity of said source of bias current whereby the rectifying junction between the first region and the second region can be polarised in the forward direction for the injection of minority carriers into the second region which are received by the third region via the rectifying junction between the second region and the third region, the third region being capable of reinjecting minority charge carriers into the fourth region which are received by the fifth region via the rectifying junction between the fourth region and the fifth region. Furthermore in such arrangements a preferred construction is that in which the second and fourth regions are present as a common semiconductor region which constitutes the emitter zones of the cross-coupled pair of transistors in the slave and the emitter zones of the said transistors to be supplied with reinjected bias current, the collector zones of the cross-coupled pair of transistors in the slave being present as surface zones within and of opposite conductivity type to the third regions, and the collector zones of the said transistors to be supplied with reinjected bias current being present as surface zones within and of opposite conductivity type to the fifth regions.

In one kind of integrated circuits of the said first form said tansistors to be supplied with reinjected bias current are separate transistors connected in the feedback path between the slave and master, the collector zones of said transistors being cross connected to the base zones of the transistors of the cross-coupled pair of transistors in the master. In a modified form of said one kind of integrated circuits said transistors to be supplied with reinjected bias current are separate transistors connected between the slave of the one master/slave arrangement and a further master of a succeeding similar master/slave arrangement. In these circuits the cross-coupled pair of transistors in the master may be supplied with bias current by a pair of current injection structures consisting of three successively arranged regions of alternating conductivity type of which the third regions constitute the base zones of said transistors, the second regions form parts of a common region and constitute the emitter zones of said transistors, the collector zones of said transistors being present as surface zones within and of opposite conductivity type to the third regions, and in each of said three-region structures the first region forming an injector region having a connection for applying one polarity of a source of bias current whereby the rectifying junction between the first region and the second region can be polarised in the forward direction for the injection of minority carriers into the second region which are received by the third region via the rectifying junction between the second region and the third region.

Such a master/slave bistable arrangement may be constructed for operation with a clock pulse source of bias current applied between the first and second regions of the three-region current injection structures associated with the master and a constant source of bias current applied between the first and second regions of the five-region current injection structures associated with the slave.

Various alternative circuit configurations may be formed by a master/slave bistable arrangement having the said clock pulse current source and the said constant current source respectively applied to the three-region and five-region current injection structures, for example when the said separate transistors to be supplied with reinjected bias current are connected in the feedback path between the slave and the master the arrangement may be in the form of a simple divide-by-two counter element having at least one output connection to the base region of one of the transistors of the cross-coupled pair in the slave. In another form, wherein the said separate transistors to be supplied with reinjected bias current are connected to a further master as previously described, a plurality of the master/slave bistable arrangements are present and form a shift register in which the connection between succeeding shift register elements is between the collector regions of the said separate transistors associated with the slave of one arrangement and the base regions of the cross-coupled pair of transistors in the master in the next succeeding arrangement. In a further form the master/slave bistable arrangement is a J-K bistable, the base zones of the said separate transistors being connected to the collector zones of further transistors which are fed with primary bias current from the fixed current source via three-layer current injection structures, the base zones of said further transistors being connected to the J and K inputs.

In another kind of integrated circuits of the said first form said transistors to be supplied with reinjected bias current are the cross-coupled pair of transistors in the master. In a modified form of this kind of integrated circuits said transistors to be supplied with reinjected bias current are the cross-coupled pair of transistors in a further master of a preceding or succeeding similar master/slave arrangement present in the circuit. In either of these circuit forms the cross-coupled pair of transistors in the master may be supplied with primary bias current by a pair of current injection structures consisting of three successively arranged regions of alternating conductivity type of which the third regions which also form the fifth regions of the said five-region current injection structures associated with the slave constitute the base zones of said transistors, the second regions form parts of a common region and constitute the emitter zones of said transistors, the collector zones of said transistors being present as surface zones within and of opposite conductivity type to the third regions, and in each of said three region structures the first region forming an injector region having a connection for applying one polarity of a source of bias current and the second region having a connection for the other polarity of said source of bias current whereby the rectifying junction between the first region and the second region can be polarised in the forward direction for the injection of minority carriers into the second region which are received by the third region via the rectifying junction between the second region and the third region.

In one specific form of such a circuit the master/slave bistable arrangement may be constructed for operation with a clock pulse source of bias current applied between the first and second regions of the three-region current injection structures associated with the master and a constant source of bias current applied between the first and second regions of the five-region current injection structures associated with the slave. Various alternative circuit configurations may be formed by such a master/slave bistable arrangement, for example, divide-by-two counter elements, shift register elements, or J-K flip-flops. In one embodiment, of the form where the transistors to be supplied with reinjected bias current are the cross-coupled pair of transistors in the master, the master/slave bistable arrangement is in the form of a divide-by-two counter element having at least one output connection to the base region of one of the transistors of the cross-coupled pair in the slave. In another embodiment, of the form where the transistors to be supplied with reinjected bias current are the cross-coupled pair of transistors in a further master of a similar succeeding master/slave arrangement, a plurality of the master/slave bistable arrangements are present and each forms a shift register element in which the transistors to be supplied with reinjected bias current associated with the slave of one master/slave arrangement are the cross-coupled pair of transistors of the next succeeding arrangement and the coupling between succeeding shift register elements is via said transistors.

In a further kind of integrated circuits of the said first form an auxiliary transistor is present and is fed with bias current by a further current injection structure comprising three successively arranged regions of alternating conductivity type of which the third region forms the base zone of the auxiliary transistor; the second region forms the emitter zone of the auxiliary transistor, said auxiliary transistor comprising two collector zones present as surface zones within and of opposite conductivity type to the third region and respectively connected to the base zones of the transistors in the cross-coupled pair in the master, the first region of the three-region current injection structure forming an injector region, the master/slave bistable arrangement being constructed for operation with a constant source of bias current applied between the first and second regions of the three-layer current injection structures associated with the master and the auxiliary transistor and a constant source of bias current applied between the first and second regions of the five-layer current injection structures associated with the slave, the base zone of the auxiliary transistor having a connection for an input of clock pulses. In these circuits in which a single current source may be employed for all the said current injection structures, the auxiliary transistor when in a conductive state is employed for diverting the primary bias currents supplied by the pair of three-layer current injection structures associated with the master. The auxiliary transistor remains in such a conductive state diverting said bias currents until the clock pulse input rises to such a value to sink the bias current supplied by the said further current injection structure to the auxiliary transistor. Such a master/slave bistable arrangement advantageously may be employed as a counter element because the output from such an element forming one stage may readily constitute the clock pulse input of the succeeding stage formed by another such element.

As shift register elements the master/slave bistable arrangements in accordance with the invention may form very compact structures and the area of the semiconductor body occupied by such a shift-register element may be as low as 0.02 mm².

In a second form of the integrated circuit in accordance with the invention the multi-layer current injection structures for supplying primary bias current to the cross-coupled pairs of transistors in the master and the slave each comprise three successively arranged regions of alternating conductivity type adjoining the one side of the semiconductor body, the third regions constituting the base zones of said cross-coupled pairs of transistors and in each of said structures the first region forming an injector region having a connection for applying one polarity of a source of bias current and the second region having a connection for the other polarity of said source of bias current, the said connections of the current injection structures associated with the said transistors in the slave being for a fixed current source and the said connections of the current injection structure associated with the said transistors in the master being for a clocked current source, further multi-layer current injector structures being present for supplying reinjected bias current to the cross-coupled pair of transistors, or transistors connected thereto, in the master and each comprising five successively arranged regions of alternating conductivity type adjoining the one side of the semiconductor body of which regions the first region forms an injector region having a connection for applying one polarity of the fixed source of bias current and the second region has a connection for the other polarity of said fixed source of bias current, the fifth regions of the five-layer current injection structures which can receive via the rectifying junction between the fourth region and the fifth region minority charge carriers reinjected by the third region into the fourth region constituting the base zones of the cross-coupled pair of transistor, or of transistors connected thereto, in the master.

In one such integrated circuit of the said second form the master/slave bistable arrangement is an R-S bistable and the supply of reinjected bias current by the five-layer current injection structures is controlled by the R and S inputs which are connected to the third regions of these current injection structures. In this circuit the fifth regions of the five-layer current injection structures may constitute the base zones of transistors whose collector zones are connected to the base zones of the cross-coupled pair of transistors in the master. Alternatively the circuit configuration may be such that the reinjected bias current is supplied by the five-layer structures directly to the base zones of the cross-coupled transistors in the master.

In another integrated circuit of the said second form the master/slave bistable arrangement is a D-type bistable and the supply of reinjected bias current by the five-layer current injection structures is controlled by a further transistor of which the base zone is formed by the third region of one five-layer current injection structure and the collector zone is connected to the third region of the other five-layer current injection structure, said further transistor being fed with bias current via the first three layers of the said one five-layer current injection structure and its base zone being connected to the D input of the arrangement.

Embodiments of the invention will now be described, by way of example, with reference to the accompanying diagrammatic drawings, in which.

Figure 1:
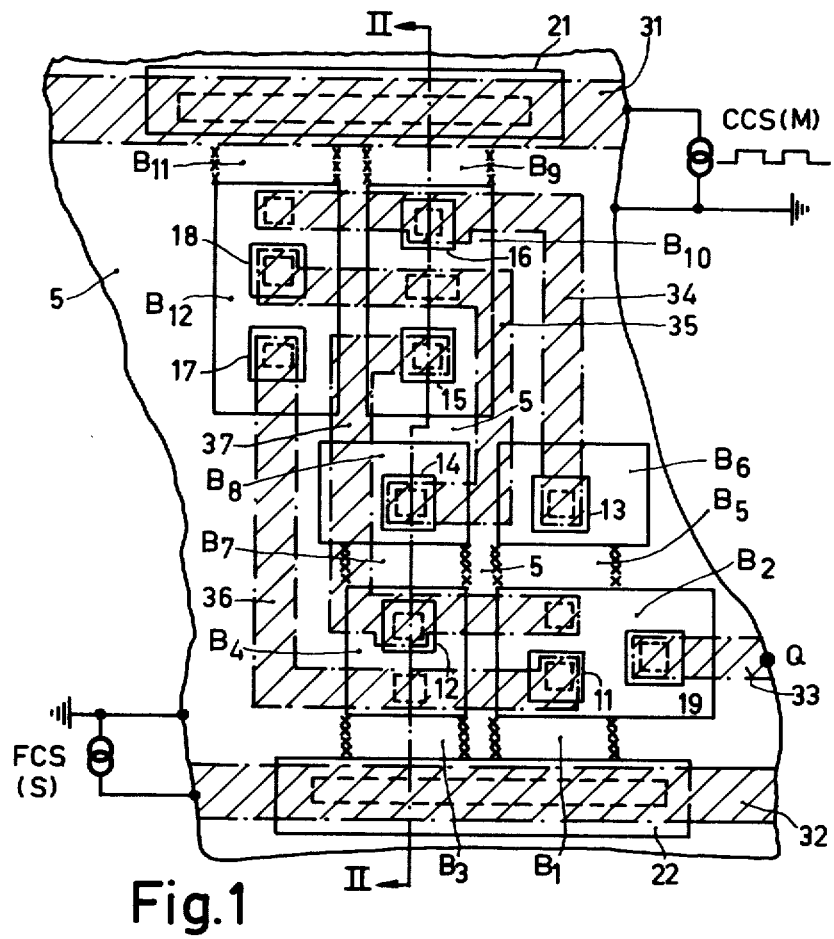
FIG. 1 is a plan view of the semiconductor body portion of part of an integrated circuit in accordance with the invention, said part being in the form of a master/slave bistable arrangement constituting a divide-by-two element and forming part of a counter circuit.
Figure 2:
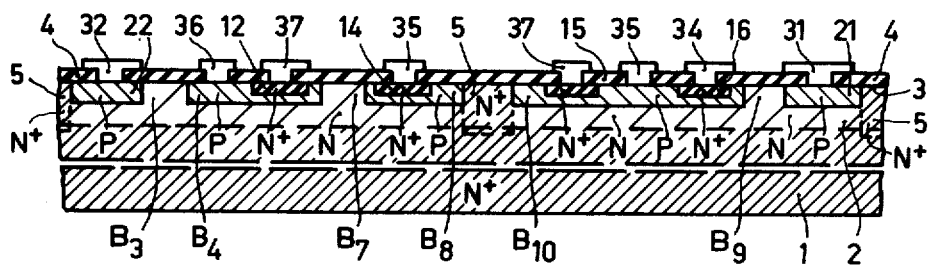
FIG. 2 is a cross-sectional view through the semiconductor body portion on the line II—II in FIG. 1.

The part of the integrated circuit shown in FIGS. 1 and 2 is a divide-by-two element of a counter circuit and comprises a master bistable circuit and a slave bistable circuit.

The circuit elements present are twelve bipolar transistors $T_1$ to $T_{12}$, of which in FIGS. 1 and 2 the base regions are indicated by the reference characters $B_1$ to $B_{12}$ inclusive. The slave bistable circuit comprises transistors $T_1$ to $T_4$ and the master bistable circuit comprises transistors $T_9$ to $T_{12}$, the transistors $T_5$ to $T_8$ being present in the feedback circuit between the slave and master. The transistors $T_1$ to $T_{12}$ are arranged adjacent one side of a semiconductor body common to all the circuit elements present.

The circuit is formed in a silicon body which comprises an $n^+$-silicon substrate 1 having thereon an n-type epitaxial layer 2. On the upper surface 3 of the n-type epitaxial layer 2 there is a silicon oxide insulating layer 4 and for the sake of clarity of illustration the layer 4 is shown as being of uniform thickness whereas in practice the layer 4 normally will be of varying thickness. A locally diffused $n^+$-region 5 extends through the epitaxial layer 2 from the surface 3 to the substrate 1 and serves to perform a separating function between individual circuit elements and groups of circuit elements as will be described herinafter. Within the epitaxial layer 2 there are a plurality of locally diffused p-type regions, each of substantially rectangular configuration. The boundaries of such p-type regions are indicated in the plan view of FIG. 1 by solid lines. Six of these p-type regions are indicated by reference characters $B_2$, $B_4$, $B_6$, $B_8$, $B_{10}$, $B_{12}$ as these regions form the base regions of transistors $T_2$, $T_4$, $T_6$, $T_8$, $T_{10}$ and $T_{12}$ respectively. Within these locally diffused p-type regions there are locally diffused $n^+$-regions 11 to 19 inclusive indicated in the plan view of FIG. 1 by solid lines. These $n^+$-regions form the collector regions of vertically arranged inverse n-p-n transistors $T_2$, $T_4$, $T_6$, $T_8$, $T_{10}$ and $T_{12}$ having the n-type epitaxial layer 2 as an emitter region which is common to all said vertically arrranged n-p-n inverse transistors. Thus within the p-type base region $B_2$ the $n^+$-regions 11 and 19 form the two collectors of the multi-collector n-p-n inverse transistor $T_2$. Similarly, within the p-type base regions $B_4$, $B_6$ and $B_8$ the $n^+$-regions 12, 13 and 14 respectively form the collector regions of the n-p-n inverse transistors $T_4$, $T_6$ and $T_8$. Within the p-type base region $B_{10}$ the $n^+$-regions 15 and 16 form the two collectors of the multi-collector n-p-n inverse transistor $T_{10}$ and within the p-type base region $B_{12}$ the $n^+$-regions 17 and 18 form the two collectors of the multi-collector n-p-n inverse transistor $T_{12}$.

Two further locally diffused p-type regions 21 and 22 extend in the epitaxial layer 2 on opposite sides of the remaining six p-type regions $B_2$, $B_4$, $B_6$, $B_8$, $B_{10}$ and $B_{12}$. The p-type regions 21 and 22 which are also indicated in the plan view of FIG. 1 by solid lines constitute the first layers of multi-layer current injection structures. Thus the p-type region 21 constitutes the first layer of two three-layer current injection structures, a first of which is formed by the p-type regions 21 and $B_{12}$ and an intermediate n-type portion of the epitaxial layer referenced $B_{11}$, and a second of which is formed by the p-type regions 21 and $B_{10}$ and an intermediate n-type portion of the epitaxial layer referenced $B_9$. These two three-layer current injection structures provide the main bias currents for the p-type base regions of the vertically arranged n-p-n transistors $T_{12}$ and $T_{10}$ and themselves may be considered as laterally arranged p-n-p transistors $T_{11}$ and $T_9$ having n-type base regions $B_{11}$ and $B_9$ with the p-type region 21 constituting an emitter region common to both lateral p-n-p transistors and the collector regions of said transistors $T_{11}$ and $T_9$ respectively being common with the base regions of the n-p-n vertical transistors $T_{12}$ and $T_{10}$.

The portions of the n-type epitaxial layer 2 forming the n-type base regions of the lateral p-n-p transistors are bounded on two opposite sides by the p-type regions 21 and $B_{11}$, $B_{12}$ and on two further opposite sides by portions of the $n^+$-diffused region 5. The latter referred to boundaries between the $n^+$-diffused region 5 and the n-type material of the epitaxial layer 2 are indicated in the plan view of FIG. 1 by chain lines.

The p-type region 22 constitutes the first layer of two five-layer current injection structures and of two three-layer current injection structures, the first three layers of a five-layer structure forming the three layers of a three-layer current injection structure. Thus, a five-layer current injection structure is formed by the p-type region 22, an adjacent portion of the n-type epitaxial layer 2 and referenced $B_3$, the p-type region $B_4$, an adjacent portion of the n-type epitaxial layer 2 and referenced $B_7$, and the p-type region $B_8$. Of these five regions the first three regions, namely the regions 22, $B_3$ and $B_4$ form a three-layer current injection structure. A further five-layer current injection structure is formed by the p-type region 22, an adjacent portion of the n-type epitaxial layer 2 and referenced $B_1$, the p-type region $B_2$, an adjacent portion of the n-type epitaxial layer 2 and referenced $B_5$, and the p-type region $B_6$. Of these five regions the first three regions namely the regions 22, $B_1$ and $B_2$ form a three-layer current injection structure.

The two three-layer current injection structures 22, $B_3$, $B_4$ and 22, $B_1$, $B_2$ provide basis current for the p-type base regions $B_4$ and $B_2$ of the vertically arranged inverse n-p-n transistors $T_4$ and $T_2$ respectively and themselves may be considered as laterally arranged p-n-p transistors $T_3$ and $T_1$ having base regions $B_3$ and $B_1$ with the p-type region 22 constituting an emitter region common to both lateral p-n-p transistors and the collector regions of said transistors $T_3$ and $T_1$ being common with the base regions of the inverse n-p-n vertical transistors $T_4$ and $T_2$.

The two five-layer current injection structures 22, $B_3$, $B_4$, $B_7$, $B_8$ and 22, $B_1$, $B_2$, $B_5$, $B_6$ provide bias current for the p-type base regions $B_8$ and $B_6$ respectively of the vertically arranged inverse n-p-n transistors $T_8$ and $T_6$. However these bias currents are appreciably smaller than the bias currents supplied by the three-layer injectors to the regions $B_4$ and $B_2$. This will now be explained in detail in the case of the three-layer and five-layer current injection structures 22, $B_3$, $B_4$ and 22, $B_3$, $B_4$, $B_7$, $B_8$.

Consider the case where a bias voltage is applied between the p-type region 22 constituting the first injector layer of the current injection structure and the n-type epitaxial layer 2 comprising the n-type regions $B_3$ and $B_7$ respectively forming the second and fourth layers of the current injection structure, sais bias voltage being applied in such a sense that the p-n junction between the p-type region 22 and the n-type region $B_3$ is in the forward direction. said are injected across said forward biased junction into the n-type region $B_3$ forming the second layer of the current injection structure and are collected by the p-type region $B_4$ forming the third layer of the current injection structure. The p-type region $B_4$ is the zone to be biased of a first circuit element, namely the inverse n-p-n vertical transistor $T_4$ and a total hole current I will be collected by this region. Positive charge therefore builds up on the region $B_4$ and its potential rises until the p-n junction between the p-type region $B_4$ and the n-type regions $B_3$ and $B_7$ comes in the forward direction. A current equal to I must flow across this p-n junction since charge cannot accumulate in the p-type region $B_4$. This current is made up of several components, namely (a) a hole current flowing from the p-type region $B_4$ and being collected by the p-type region 22, since the p-n-p transistor formed by regions 22, $B_3$, $B_4$ is saturated, (b) a hole current which flows from region $B_4$ and recombines with electrons in the n-type regions $B_3$ and $B_7$ and the part of the n-type epitaxial layer 2 below the p-type region $B_4$, (c) an electron current, most of which forms the emitter current in the inverse n-p-n vertical transistor $T_4$ of which the p-type region $B_4$ forms the base region, and (d) a current of holes which are reinjected from the p-type region $B_4$ into the n-type region $B_7$ constituting the fourth layer of the five-layer current injection structure and are collected by the p-type region $B_8$ forming the fifth layer of the five-layer current injection structure. The last mentioned hole current (d) constitutes a bias current supplied to a second circuit element, in this case the fifth layer of the current injection structure constituting the base zone $B_8$ of the inverse n-p-n vertical transistor $T_8$. Due to the existence of the current components (a), (b), and (c) the bias current (d) supplied to $T_8$ by the five-layer current injection structure is considerably less than the bias current supplied to $T_4$ by the three-layer current injection structure. In the circuit shown in FIGS. 1 and 2 the bias current supplied to $T_4$ by the three-layer current injection structure typically may be of an order of magnitude greater than the bias current supplied to $T_8$ by the five-layer current injection structure. In the case, for example, where 100 units of current flow into the p-type injector region 22, typically with a structure as shown in FIGS. 1 and 2 one would expect a bias current of between 50 and 70 units to be supplied by the three-layer injection structure to the p-type base region $B_4$ of transistor $T_4$ and a bias current of between 5 and 10 units to be supplied by the five-layer injection structure to the p-type base region $B_8$ of transistor $T_8$. The ratio of these two bias currents can be predetermined by various structural features, for example, by the area of the p-type region $B_4$ and the separation of the p-type region $B_4$ and the separation of the p-type regions $B_4$ and $B_8$. The magnitude of the bias current supplied to the p-type region $B_4$ by the three-layer injection structure with respect to the current flowing in the p-type injector region 22 can be predetermined by various structural features including the spacing of the p-type regions 22 and $B_4$. The said ratio between the bias currents supplied to the zones $B_4$ and $B_8$ by the three-layer and five-layer injection structures ideally should remain constant over a wide range of supply currents, for example, in the circuit described over a range in which the said 100 units of current lies in the range of between 10 nanoamps and 10 milliamps.

It is mentioned that the separation of the p-type region 22 and the p-type region $B_8$ constituting the fifth layer of the five-layer current injection structure, that is the distance in the n-type material of the epitaxial layer 2 between these regions, is considerably greater than a minority carrier diffusion length in the said n-type material and therefore direct injection of holes from the p-type region 22 into the p-type region $B_8$ does not occur.

In a similar manner the bias current supplied to the base zone $B_2$ of the inverse n-p-n vertical transistor $T_2$ by the three-layer injection structure 22, $B_1$, $B_2$, can be an order of magnitude greater than the bias current supplied to the base zone $B_6$ of the inverse n-p-n vertical transistor $T_6$ by the five-layer injection structure 22, $B_1$, $B_2$, $B_5$, $B_6$. With the arrangement shown the bias currents supplied to the base zones of the inverse n-p-n vertical transistors $T_2$ and $T_4$ are mutually substantially equal as also are the bias currents supplied to the base zones of the inverse n-p-n vertical transistors $T_6$ and $T_2$ and the bias currents supplied to the base zones of the inverse n-p-n vertical transistors $T_{10}$ and $T_{12}$.

The two five-layer current injection structures which provide bias current for the p-type base regions $B_8$ and $B_6$ of the inverse n-p-n vertical transistors $T_8$ and $T_6$ respectively each may be considered as the series connection of two lateral p-n-p transistors in which the collector region of the first lateral p-n-p transistor ($T_3$ or $T_1$) is common with the emitter region of the second lateral p-n-p transistor ($T_7$ or $T_5$), said first and second lateral transistors in the present example having n-type base regions which are interconnected via the n$^+$-substrate 1. The p-type collector regions of the lateral p-n-p transistors $T_7$ and $T_5$ respectively are common with the base regions $B_8$ and $B_6$ of the vertical n-p-n inverse transistors $T_8$ and $T_6$. The portions of the n-type epitaxial layer 2 forming the n-type base regions $B_7$ and $B_5$ of the lateral p-n-p transistors $T_7$ and $T_5$ are bounded on two opposite sides by the p-type regions $B_4$, $B_8$ and $B_2$, $B_6$ and on two further opposite sides by portions of the n$^+$-diffused region 5. The latter referred to boundaries between the n$^+$-diffused region 5 and the n-type material of the epitaxial layer 2 are indicated in FIG. 1 by chain lines.

The presence of the portions of the n$^+$-diffused region 5 which adjoin and partially surround the p-type injector layers 21 and 22 the six other p-type regions in addition to providing electrical separation between these p-type regions also facilitates the confinement of injected current in the form of holes to the desired portions of the n-type epitaxial layer 2. This confinement of the injected current increases the effective diffusion length of holes in the n-type layer 2 and aids in increasing the current handling capability of the vertical inverse n-p-n transistors. Furthermore the presence of the portions of the n⁺-diffused region 5 between adjoining edges of adjacent p-type regions serves to inhibit parasitic p-n-p transistor action between said regions. The n⁺-n junction between the substrate 1 and epitaxial layer 2 together with the n⁺-n junctions between portion of the n⁺-zone 5 and the n-type portions $B_1$, $B_3$, $B_5$, $B_7$, $B_9$, $B_{11}$ of the epitaxial layer 2 constitute a barrier for the injected holes. Although in this embodiment the p-type regions extend only partially through the n-type epitaxial layer 2 it is advantageous for the p-type regions to adjoin the n⁺-substrate 1 as closely as possible.

The p-type injector regions 21 and 22 are provided with connection conductors in the form of aluminium tracks 31 and 32 respectively which extend on the surface of the silicon oxide layer 4 and form contact with the regions 21 and 22 at openings in the layer 4.

In the plan view of FIG. 1 all openings in the silicon oxide layer 4 are shown in broken lines, all aluminium tracks are shown in cross-hatched shading with chain-dot line boundaries, and the boundaries of diffused regions are shown in solid lines with the exception of the n⁺-n boundaries which are shown as a line of crosses. Further conductive tracks 33, 34, 35, 36 and 37 of aluminium extend on the surface silicon oxide layer 4 and form contact with various different semiconductor regions through openings in the layer 4. The conductive track 33 connected to a collector region 19 of transistor $T_2$ forms as output connection conductor and is further designated by reference Q. The tracks 34 to 37 inclusive form interconnections between various regions of the transistors present in the master and slave bistable elements.

The p-type injector region 22 is operated as a fixed current injector with a constant current source between a connection to the track 31 and a connection to the n⁺-substrate 1 which is connected at earth potential. In FIG. 1 this constant current source which supplied bias current to transistors in the slave bistable element is designated FCS(S).

The p-type injector region 21 is operated as a variable current injector with applied lock pulses which may be superimposed on a constant current between a connection to the track 32 and a connection to the n⁺-substate 1. In FIG. 1 this clocked current source which supplies bias current in the master bistable element is designated CCS(M).

Figure 3:
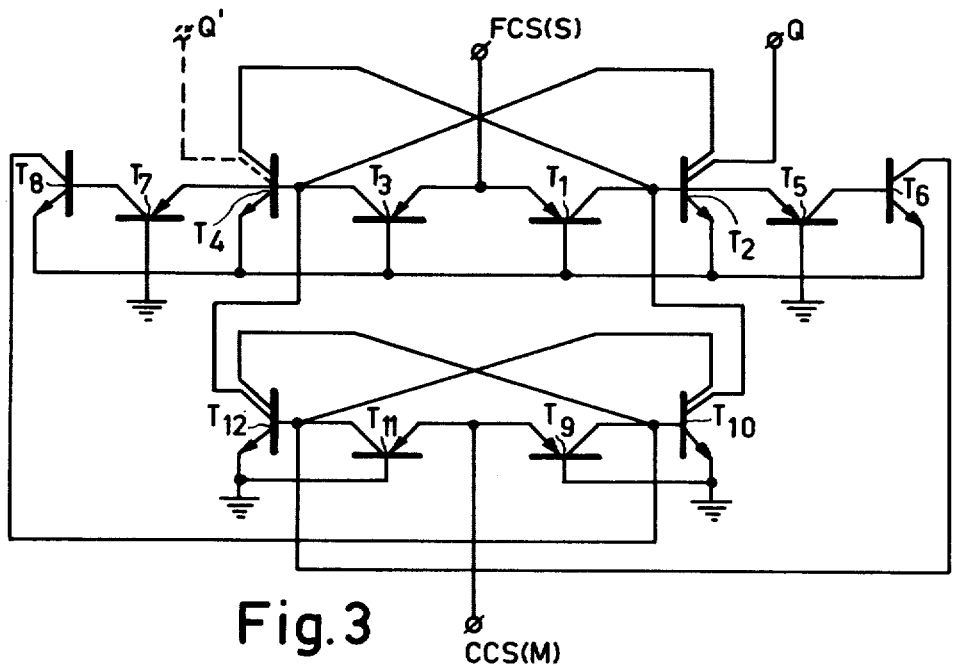
FIG. 3 is a circuit diagram of the part of the integrated circuit shown in FIGS. 1 and 2.

FIG. 3 is a circuit diagram of the part of the integrated circuit shown in FIGS. 1 and 2, the base symbols of the lateral p-n-p transistors $T_1$, $T_3$, $T_5$, $T_7$, $T_9$, $T_{11}$ being shown as horizontal lines and the base symbols of the vertical n-p-n transistors $T_2$, $T_4$, $T_6$, $T_8$, $T_{10}$, $T_{12}$ being shown as vertical lines. The n-p-n transistor pair $T_2$ and $T_4$ of which the bias currents are supplied by the p-n-p transistors $T_1$ and $T_3$ connected to the fixed current source are cross-coupled to form a bistable element which acts as the slave in the master/slave configuration. The n-p-n transistor pair $T_{10}$ and $T_{12}$ of which the bias currents are supplied by the p-n-p transistors $T_9$ and $T_{11}$ connected to the clocked current source as similarly cross-coupled to form a bistable element which acts as the master in the master-slave configuration.

The master can operate directly on the slave via coupling to the bases of transistor $T_2$ and $T_4$. The feedback from the master is via n-p-n transistors $T_6$ and $T_8$ the bias currents of which are supplied by the p-n-p transistors $T_5$ and $T_7$ forming part of the previously described five-layer current injector structures. The output Q of this divide-by-two circuit is taken from a collector region of transistor $T_2$. FIG. 3 indicates in dotted line that a complementary output Q' may be derived from a further collector region, when provided, in transistor $T_4$.

In the slave bistable the emitters of transistors $T_4$ and $T_2$ are connected to a datum level, which is shown as earth potential. One of the collectors of transistor $T_2$ is connected to the base of transistor $T_4$ and one of the collectors of transistor $T_4$ is connected to the base of transistor $T_2$, thus forming the bistable element. The emitters of transistors $T_3$ and $T_1$ are connected to the fixed current source FCS. The bases of transistors $T_1$ and $T_3$ are connected to earth and the collectors of transistors $T_1$ and $T_3$ are connected respectively to bases of transistors $T_2$ and $T_4$, and to the emitters of transistors $T_5$ and $T_7$. The bases of transistors $T_5$ and $T_7$ are connected to earth and the collectors of transistors $T_5$ and $T_7$ are connected respectively to the bases of transistors $T_6$ and $T_8$. Transistors $T_6$ and $T_8$ are grounded emitter stages and the collectors of transistors $T_6$ and $T_8$ are connected respectively to the bases of transistors $T_{12}$ and $T_{10}$ in the master bistable.

In the master bistable the emitters of transistors $T_{11}$ and $T_9$ are commoned and are connected to the clocked current source CCS. The bases of transistors $T_{11}$ and $T_9$ are connected to earth and the collectors of transistors $T_9$ and $T_{11}$ are connected respectively to the bases of transistors $T_{10}$ and $T_{12}$. In the multi-collector transistors $T_{10}$ and $T_{12}$, one collector of $T_{10}$ is connected to the base of transistor $T_{12}$ and one collector of transistor $T_{12}$ is connected to the base of transistor $T_{10}$. The second collector of transistor $T_{12}$ is connected to the base of transistor $T_4$ and the second collector of transistor $T_{10}$ is connected to the base of transistor $T_2$ thus forming the feed forward from the master bistable to the slave bistable. The emitters of transistors $T_{12}$ and $T_{10}$ are connected to earth.

The operation of the circuit is as follows. The bias current fed to the bases of transistors $T_2$ and $T_4$ is a constant current, whereas the bias current fed into the bases of transistors $T_{10}$ and $T_{12}$ is varied between a high level and a low level as determined by the clocked current source CCS. It is assumed for the purposes of this description that the high level current of the clocked current source is equal to the fixed current supplied to the slave bistable.

Assuming now that the current supplied at CCS is at the high level and that the condition of the slave bistable is such that transistor $T_2$ is ON and transistor $T_4$ is therefore OFF. For a stable condition transistor $T_{10}$ must therefore be OFF and transistor $T_{12}$ must be ON. Current is therefore fed from the fixed current source FCS to the emitter of transistor $T_5$ which will be at a positive potential with respect to earth. Base current will therefore be supplied to transistor $T_6$ but as described with reference to FIGS. 1 and 2 the base current to transistor $T_6$ will be an order of magnitude less than the base current supplied to transistor $T_2$, and also an order of magnitude less than the base current supplied to the transistor $T_{12}$ from the clocked current source at the high level. Due to transistor $T_4$ being OFF and the base of transistor $T_7$ being held low no bias current is supplied to transistor $T_8$ by the lateral p-n-p transistor $T_7$.

As the base current of transistor $T_6$ is thus restricted it cannot sink the whole of the base current for transistor $T_{12}$. Therefore transistor $T_{12}$ continues to conduct and transistor $T_6$ conducts out of saturation. The state of the master bistable with transistor $T_{12}$ conducting therefore remains unchanged.

If the master bistable is now clocked by reducing the current supplied by CCS the base current for transistor $T_{12}$ is therefore reduced on the falling edge of the clock pulse. As the base current of transistor $T_{12}$ is reduced so its capacity to sink all the base current for transistor $T_4$ is also reduced. Bias current to transistor $T_4$ is however still diverted by the collector of transistor $T_2$ and transistor $T_4$ will remain in the OFF condition due to the cross-coupling between transistor $T_2$ and transistor $T_4$. At this point the feed forward between the master bistable and slave bistable is of no effect and therefore the master bistable is now effectively isolated from the slave bistable.

As the current supplied by CCS is further reduced, on the falling edge of the clock pulse, transistor $T_6$ becomes progressively more able to divert all the base current for transistor $T_{12}$, supplied through transistor $T_{11}$. When transistor $T_6$ is able to divert all the current supplied via transistor $T_{11}$ there is no base current supplied to transistor $T_{12}$ and transistor $T_{12}$ will turn OFF. Transistor $T_{10}$ will therefore turn ON but at a very low current level since the base current supplied by $T_9$ will be small. The master will be isolated from the slave and assuming that the clocked current source is not reduced to zero the state of the master bistable will have been changed to a condition predetermined by the slave bistable. Information cannot be propagated to the output since the slave is isolated at this time. If the clocked current source were to be reduced to zero the master will be de-energised but the preconditioning of the master by the slave will take place immediately the clocked current source is powered up again.

When, following the period in which the clocked current source is at the low level, the master is powered up again by the current supply by CCS increasing from said low level, the current supplied via transistor $T_{11}$ to the base of transistor $T_{12}$ will be greater than the current which can be sunk by transistor $T_6$ and therefore above this current level transistor $T_6$ will be unable to effect the condition of the master bistable and hence the master becomes effectively isolated from feedback.

As the current supplied by CCS increases transistor $T_{10}$ becomes able to sink progressively more of the base current of transistor $T_2$ until eventually transistor $T_2$ will turn OFF. Therefore transistor $T_4$ will turn ON by the cross-coupling action of the slave bistable and at this point the condition of the master bistable will have been transferred to the slave bistable. The sequence of operations is then repeated, the output Q being a square wave at half the clock pulse frequency of CCS and this circuit therefore constitutes a divide-by-two circuit which operates with a master/slave action which eliminates so-called race hazards.

By addition of other transistors to the master bistable element, the divide-by-two circuit can be adapted to form a J-K bistable or other bistable element, for example a shift register element. Thus the device structure shown in FIGS. 1 and 2 can be regarded as a form of adaptable building block for many conventional bistable elements.

Figure 4:
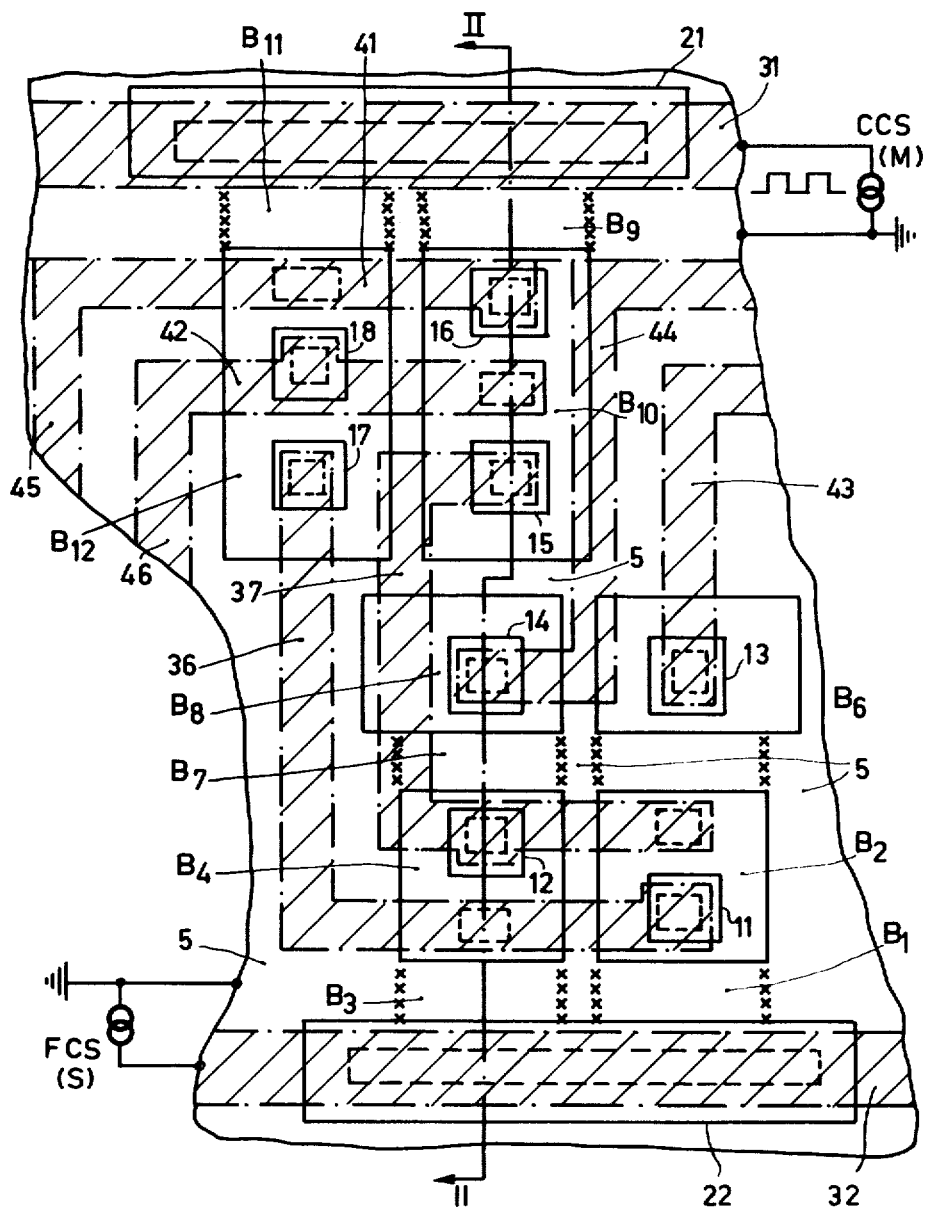
FIG. 4 is a plan view of the semiconductor body portion of part of another integrated circuit in accordance with the invention, said part being a master/slave bistable arrangement forming an element of a shift register circuit.

One such adaptation will now be described with reference to FIG. 4. In this Figure, which shows in plan view a master/slave shift register element adaptation of the basic building element of FIGS. 1 and 2 and its interconnections with succeeding and preceding shift register elements, portions, regions and layers corresponding to those in FIG. 1 are indicated by the same reference numerals and letters. With respect to the various regions in the semiconductor body the only difference resides in the p-type region $B_2$ which in FIG. 4 is of smaller area and only includes a single n-type surface region, namely the region 11. The interconnection pattern of aluminium tracks differs in that the output from the slave comprising transistors $T_1$ to $T_8$ is to the master of the following shift register element via conductive tracks 43 and 44 connected to the n-type collector regions 13 and 14 of the inverse n-p-n vertical transistors $T_6$ and $T_8$ of the slave and therefore the reinjected bias currents supplied to transistors $T_6$ and $T_8$ are employed for the preconditioning of the said master of the following shift register element and not of the master shown in the drawing and comprising transistors $T_{10}$ to $T_{12}$. The input to the master comprising ransistors $T_{10}$ to $T_{12}$ from the slave of the preceding shift register element is via conductive tracks 45 and 46 and the preconditioning of this master is obtained by the reinjected bias currents supplied to the further transistors $T_6$ and $T_8$ associated with the slave of said preceding element. The track 45 is connected to the p-type base region $B_{12}$ of the inverse n-p-n vertical transistor $T_{12}$ and to the n-type collector region 16 of the inverse n-p-n vertical transistor $T_{10}$. The track 46 is connected to the n-type collector region 18 of transistor $T_{12}$ and to the p-type base region $B_{10}$ of transistor $T_{10}$. In this manner a very compact shift register element is obtained and it will be appreciated that a series array of such shift register elements may be fed with the necessary bias currents from common injectors 21, 31 and 22, 32 on opposite sides of the array, the one injector 22, 32 feeding the slave bistables being connected to the fixed current source FCS and the other injector 21, 31 feeding the master bistables being connected to the clocked current source CCS.

Figure 5:
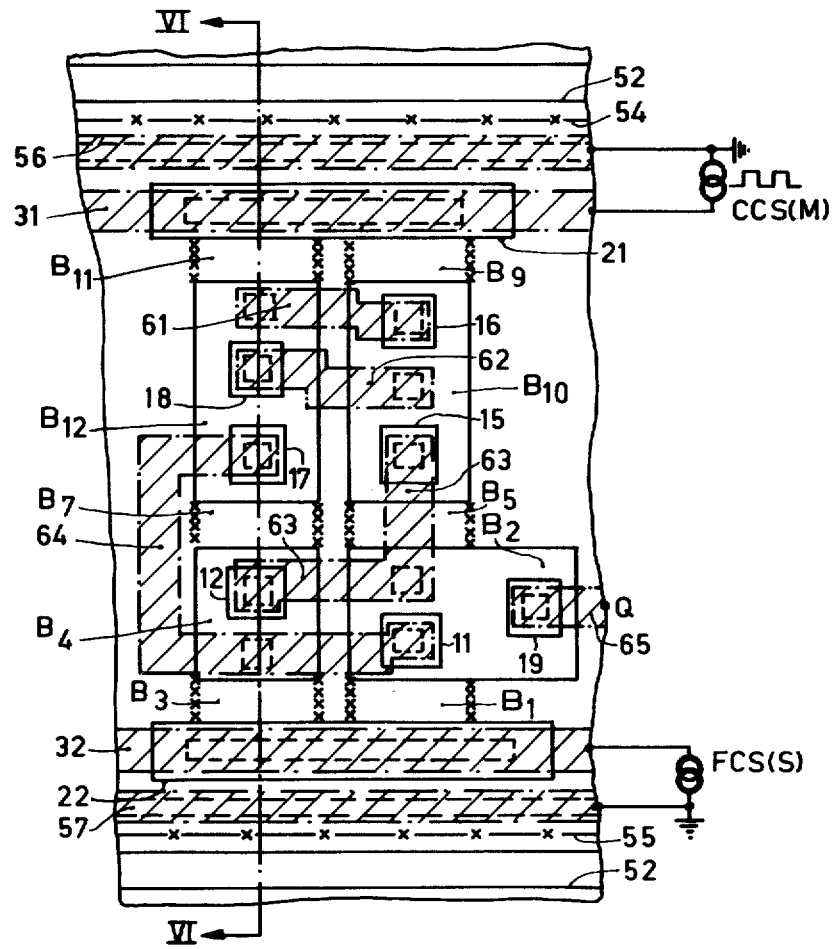
FIG. 5 is a plan view of the semiconductor body portion of part of a further integrated circuit in accordance with the invention, said part being in the form of a master/slave bistable arrangement constituting a divide-by-two element and forming part of a counter circuit.
Figure 6:
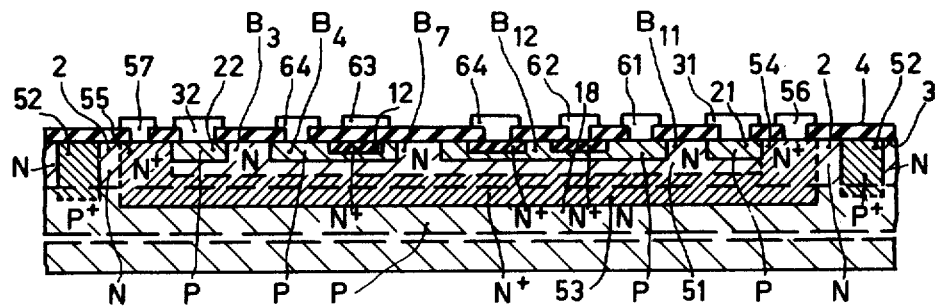
FIG. 6 is a cross-sectional view through the semiconductor body portion on the line VI—VI in FIG. 5.

Referring now to FIGS. 5 and 6 there is shown in these Figures part of another integrated circuit and in the form of a divide-by-two element of a counter circuit, said element comprising master bistable current and a slave bistable circuit.

The individual component circuit elements present are similar to those shown in FIGS. 1 and 2 with the main difference residing in the fact that the number of transistors is now ten instead of twelve, the transistors $T_6$ and $T_8$ present in the FIGS. 1 and 2 embodiment not being present in the embodiment of FIG. 5. The base regions of the transistors $T_1$ to $T_5$, $T_7$ and $T_9$ to $T_{12}$ are indicated by the reference characters $B_1$ to $B_5$, $B_7$ and $B_9$ to $B_{12}$. The slave bistable circuit comprises transistors $T_9$ to $T_{12}$ and the master bistable circuit comprises transistors $T_1$ to $T_5$ and $T_7$. These transistors are arranged adjacent one side of a semiconductor body common to all the circuit elements present.

In FIGS. 5 and 6 various regions and layers which correspond to those present in the embodiment of FIGS. 1 and 2 are indicated with the same reference numerals and characters and the line notation for various regions in FIGS. 1 and 5 is identical. The silicon body comprises a p-type substrate 51 having thereon an n-type epitaxial layer. On the upper surface 3 of the epitaxial layer there is a silicon oxide layer 4 of varying thickness. Diffused p$^+$-type regions in the form of strips 52 extend from the surface of the eiptaxial layer 3 to the p-type substrate 51 and serve for the electrical isolation of various groups of circuit elements. In the present embodiment the counter element is an element based on current injection principles and the p$^+$-strips such as the strips 52 serve for the electrical isolation of current injection circuitry in the semiconductor body from other forms of circuitry such as TTL (Transistor-Transistor Logic) peripheral circuitry. The structure shown in FIGS. 5 and 6 chosen for the current injection circuitry enables the current injection circuitry and the peripheral circuitry, such as TTL circuitry, to be provided simultaneously in the semiconductor body by processing operations conventionally employed for the manufacture of the peripheral circuitry.

An n$^+$-buried layer 53 is present in the vicinity of the interface between the n-type epitaxial layer 2 and the p-type substrate 51. Further strip-shaped n$^+$-regions 54 and 55 extend between the surface of the epitaxial layer 2 and the peripheral edges of the buried layer 53. These n$^+$-regions are contacted by aluminium conductive tracks 56 and 57 respectively via apertures in the silicon oxide layer 4. In this element there are only six locally diffused p-type regions, namely the injector regions 21 and 22 and the regions $B_2$, $B_4$, $B_{10}$ and $B_{12}$, the latter four regions respectively forming the base regions of inverse n-p-n vertical transistors $T_2$, $T_4$, $T_{10}$ and $T_{12}$. Within these locally diffused p-type regions there are seven locally diffused n$^+$-regions 11, 12, 15, 16, 17, 18 and 19 which form the collector regions of the inverse n-p-n vertical transistors $T_2$, $T_4$, $T_{10}$ and $T_{12}$ having the n-type epitaxial layer 2 as an emitter region which is common to all said inverse n-p-n vertical transistors.

The p-type injector regions 21 and 22 constitute the first layer of multi-layer current injection structures. Thus the p-type region 12 constitutes the first layer of two three-layer current injection structures, namely one formed by the regions 21, $B_9$ and $B_{10}$ and another formed by the regions 21, $B_{11}$ and $B_{12}$. These two three-layer current injection structures provide the main bias currents for the p-type base regions $B_{10}$ and $B_{12}$ of the inverse n-p-n vertical transistors $T_{10}$ and $T_{12}$ and themselves may be considered as laterally arranged p-n-p transistors $T_9$ and $T_{11}$.

The portions $B_9$ and $B_{11}$ of the n-type epitaxial layer 2 forming the base regions of transistors $T_9$ and $T_{11}$ are bounded on two opposite sides by the p-type regions 21 and $B_{10}$, $B_{12}$ and on two further opposite sides by portions of the n$^+$-diffused region 5 as in the embodiment shown in FIGS. 1 and 2.

The p-type region 22 constitutes the first layer of two three-layer current injection structures and two five-layer current injection structures, the first three layers of a five-layer structure forming the three layers of a three-layer structure. Thus, as in the embodiment shown in FIGS. 1 and 2, the layers 22, $B_1$, $B_2$ and 22, $B_3$, $B_4$ form a pair of three-layer current injection structures. These provide bias current for the p-type base regions $B_2$ and $B_4$ of the inverse n-p-n vertical transistors $T_2$ and $T_4$ respectively and themselves may be considered as laterally arranged p-n-p transistors $T_1$ and $T_3$.

Said p-n-p transistors $T_1$ and $T_3$ have their n-type base regions $B_1$ and $B_3$ bounded on two opposite sides by the n$^+$-region 5. The transistors $T_2$ and $T_4$ may be considered as first circuit elements having zones $B_2$ and $B_4$ to be biased.

Between the adjacent peripheries of the p-type regions $B_2$ and $B_{10}$ the n$^+$-region 5 is not present and thus these regions are separated by n-type material of the epitaxial layer 2 and referenced $B_5$. Similarly the p-type regions $B_4$ and $B_{12}$ are separated by n-type material of the epitaxial layer 2 and referenced $B_7$. A five-layer current injection structure is thus formed by the regions 22, $B_1$, $B_2$, $B_5$, $B_{10}$ and another five-layer current injection structure is formed by the regions 22, $B_3$, $B_4$, $B_7$, $B_{12}$. These can provide bias currents of relatively smaller magnitude for the p-type base regions $B_{10}$ and $B_{12}$ of the inverse n-p-n vertical transistors $T_{10}$ and $T_{12}$ in the case when a clocked current source CCS(M) applied to the master via the conductive tracks 31 and 56 is at a low level.

For the same reasons as described with reference to FIGS. 1 and 2 the bias currents which can be supplied by the five-layer injection structures to the base zones $B_{10}$ and $B_{12}$ of the inverse n-p-n vertical transistors $T_{10}$ and $T_{12}$, are of considerably smaller magnitude than the bias currents supplied by the three-layer injection structures (having their layers common with the first three layers of said five-layer injection structures) to the base zones $B_2$ and $B_4$ of the inverse n-p-n vertical transistors $T_2$ and $T_4$. Again by suitable choice of the dimensions of the various regions present the ratio between said bias currents can be predetermined, for example by suitable choice of such parameters as the area of the p-type regions $B_2$ and $B_4$ and the separation of the regions $B_{10}$ and $B_2$ and the separations of the regions $B_{12}$ and $B_4$. Furthermore it is mentioned that the separation of the injector region 22 from the fifth layers $B_{10}$ and $B_{12}$ of the five-layer structures is considerably in excess of a minority carrier diffusion length in the n-type epitaxial layer 2 and therfore direct movement of injected holes to the p-type regions $B_{10}$ and $B_{12}$ does not occur.

The two five-layer current injection structures which can provide the relatively smaller magnitude bias currents for the base zones $B_{10}$ and $B_{12}$ may be considered as the series connection of two lateral p-n-p transistors in which the collector region of the first lateral p-n-p transistor ($T_1$ or $T_3$) is common with the emitter region of the second lateral p-n-p transistor ($T_5$ or $T_7$), said first and second lateral transistors having n-type base regions which are interconnected via the n$^+$-buried layer 53. The p-type collector regions of the lateral p-n-p transistors $T_5$ and $T_7$ are common with the base regions $B_{10}$ and $B_{12}$ respectively of the inverse n-p-n vertical transistors $T_{10}$ and $T_{12}$, said base regions being fed with main bias currents from the p-n-p transistor three-layer injection structures 21, $B_9$, $B_{10}$ and 21, $B_{11}$, $B_{12}$ when the clocked current source CCS is at a higher level.

Aluminium conductive tracks 61 to 64 inclusive are situated on the surface of the silicon oxide layer 4 and extend in contact with various regions via apertures in said oxide layer. These tracks form interconnection paths between various regions in the master bistable and slave bistable elements. A further aluminium conductive track 65 connected to a collector region 19 of the transistor $T_2$ forms an output connection conductor and is further designated by reference Q.

As in the previous embodiment the p-type injector region 22 is operated as a fixed current injector with a constant current source designated FCS in FIG. 5 between a connection to the tracks 32 and 57. The p-type injector region 21 is operated as a variable current injector with applied clock pulses supplied via a clocked current source between connections to the tracks 31 and 56 and designated CCS in FIG. 5.

Figure 7:
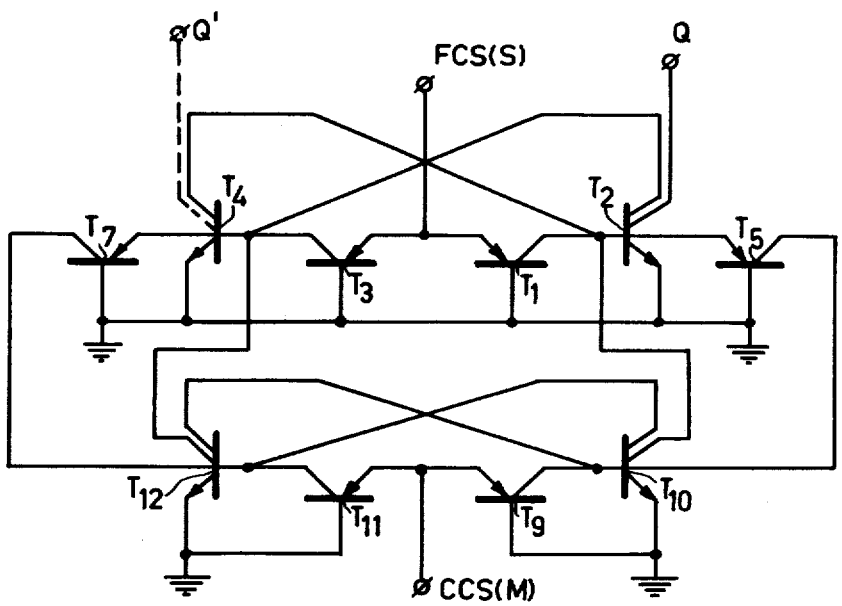
FIG. 7 is a circuit diagram of the part of the integrated circuit shown in FIGS. 5 and 6.

FIG. 7 is a circuit diagram of the part of the integrated circuit shown in FIGS. 5 and 6, the base symbols of the lateral p-n-p transistors $T_1$, $T_3$, $T_5$, $T_7$, $T_9$, $T_{11}$ being shown as horizontal lines and the base symbols of the vertical n-p-n transistors $T_2$, $T_4$, $T_{10}$, $T_{12}$ being shown as vertical lines. It will be clear that this circuit is similar to that shown in FIG. 3 in respect of the cross-coupled transistor pairs $T_2$, $T_4$ and $T_{10}$, $T_{12}$ together with their bias current supplied from the fixed current source FCS and the clocked current souce CCS. Also the output Q is the same as in the FIG. 3 circuit and the same possibility exists for the adaptation of the structure to provide a complementary output Q'. The difference in the circuits resides in the feedback loop from slave to master. In the circuit shown in FIG. 7 the collector of $T_7$ is connected directly to the base of $T_{12}$ and the collector of $T_5$ is connected directly to the base of transistor $T_{10}$. The circuit of FIG. 7 functions in a similar manner to the circuit of FIG. 3. When the clocked current source applied to the master decreases towards the low level, base current is supplied to one side of the master via the feedback from the slave, that is by one of the said five-layer injection structures, and this predetermines the state of the master which is locked into the predetermined state as the clocked current source applied to the master later increases from the low level. The sequence of operation is the same as described with reference to FIG. 3 and a similar master/slave action is achieved.

Figure 8:
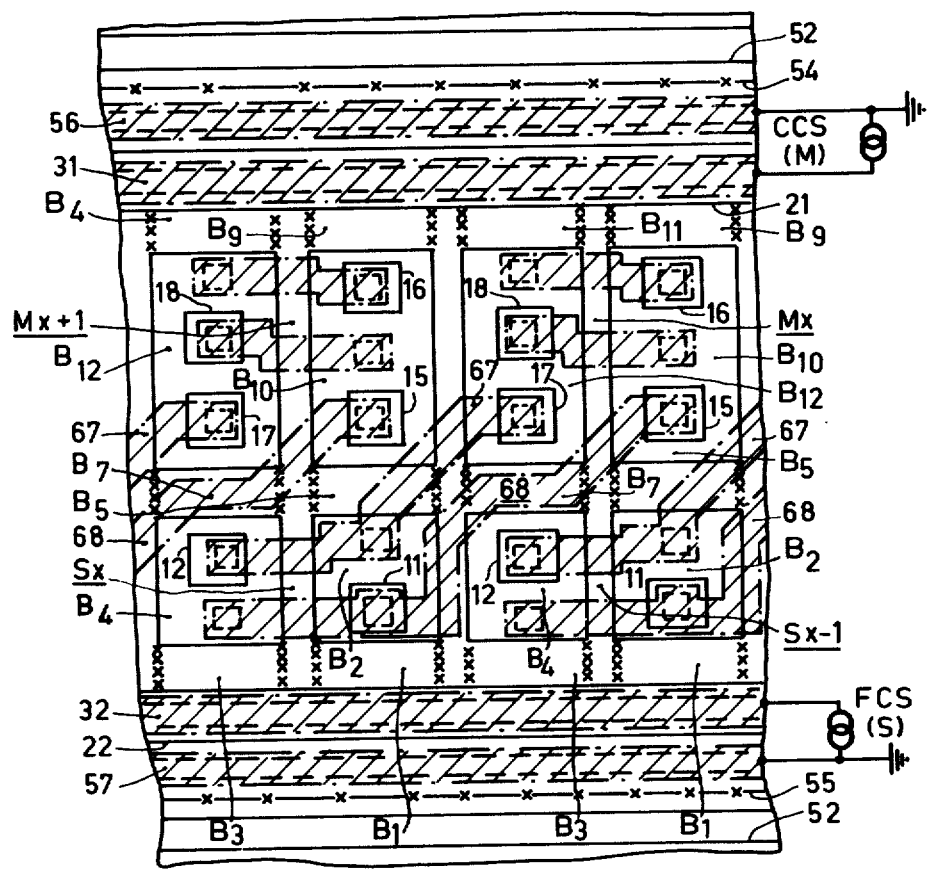
FIG. 8 is a plan view of the semiconductor body portion of another integrated circuit in accordance with the invention, said part being in the form of a plurality of master/slave bistable arrangements forming elements of part of a shift register.

The divide-by-two counter element shown in FIGS. 5 and 6 can be adapted to form a J-K bistable or other bistable element, for example a shift register element. Thus the device structure shown in FIGS. 5 and 6 may also be regarded as a form of adaptable building block for many conventional bistable circuits. One such adaptation will now be described with reference to FIG. 8. This Figure shows a plan view one complete master/slave shift register element $M_x$, $S_x$ which is an adaptation of the basic building element of FIGS. 5 and 6. The Figure also shows the slave $S_{x-1}$ of the preceding shift register element and the master $M_{x+1}$ of the succeeding shift register element, said preceding and succeeding elements being identical in structure to the complete element $M_x$, $S_x$. Portions, layers and regions corresponding to those present in FIGS. 5 and 6 are indicated with the same references in FIG. 8. In each complete master-slave element the p-type region $B_2$ in the slave is of substantially the same area as the p-type region $B_4$ and only includes a single n-type surface region, namely the region 11. It will be noted that in FIG. 8 the master and slave in each complete element ($M_x$, $S_x$) are laterally displaced with respect to one another. The master $M_x$ and slave $S_x$ are interconnected by aluminium tracks 67 and 68. Thus the track 67 forms an interconnection between the n-type collector region 12 of the inverse n-p-n vertical transistor $T_4$ and the p-type base region $B_2$ of the inverse n-p-n vertical transistor $T_2$ in the slave $S_x$, further extends over the surface insulating layer and forms a connection to the n-type collector region 17 of the inverse n-p-n vertical transistor $T_{12}$ in the master $M_x$. Similarly the track 68 forms an interconnection between the p-type base region $B_4$ of the inverse n-p-n vertical transistor $T_4$ and the n-type collector region 11 of the inverse n-p-n vertical transistor $T_2$ in the slave $S_x$, further extends over the surface insulating layer and forms a connection to the n-type collector region 15 of the inverse n-p-n vertical transistor $T_{10}$ in the master $M_x$.

In this embodiment the coupling between succeeding shift register elements is achieved by means of the reinjected bias currents supplied by the lateral p-n-p transistors $B_2$, $B_5$, $B_{10}$ and $B_4$, $B_7$, $B_{12}$ to the base zones of the further transistors constituted by the master transistors $T_{10}$ and $T_{12}$ respectively when the clocked current source is effective in reducing the main bias currents to said transistors $T_{10}$ and $T_{12}$. Thus the slave $S_{x-1}$ operates on the master $M_x$, as does the slave $S_x$ on the master $M_{x+1}$, via the preconditioning obtained with said reinjected bias currents. It will be noted that in the shift register embodiment of FIG. 8, data is transferred in a direction from right to left, whereas in the shift register embodiment of FIG. 4, data is transferred in a direction from left to right.

A further embodiment of a divide-by-two counter element of an integrated circuit will now be described with reference to FIGS. 9 and 10. This element comprises a master/slave bistable element having the same transistors and interconnections as are present in the master/slave element shown in FIGS. 5 and 6, corresponding parts being indicated by the same reference numerals and characters. The p-type injector regions 21 and 22 are connected together through a single aluminium track 71 and in operation a fixed current source FCS is applied between the p-type injectors 21, 22 and the n-type epitaxial layer 2.

An additional p-type region $B_{14}$ is present and is separated from the p-type injector region 21 by a portion $B_{13}$ of the n-type epitaxial layer 2. Within the p-type region $B_{14}$ there are two n-type regions 73 and 74. A further three-layer current injection structure is formed by the regions 21, $B_{13}$, $B_{14}$ and may be considered as a lateral p-n-p transistor $T_{13}$. This supplies bias current to the region $B_{14}$ which constitutes the base zone of an auxiliary inverse n-p-n vertical transistor $T_{14}$ of which the n-type emitter zone is formed by the n-type epitaxial layer 2 and two collector zones are formed by the n-type regions 73 and 74. an aluminium track 75 makes contact with the base region $B_{14}$ via an opening in the surface oxide layer and in operation this track is connected to an input source of clock pulses CPI.

One collector region 73 of the auxiliary transistor $T_{14}$ is connected to a collector region of transistor $T_{10}$ and the other collector region 74 of transistor $T_{14}$ is connected to a collector region of transistor $T_{12}$.

Figure 9:
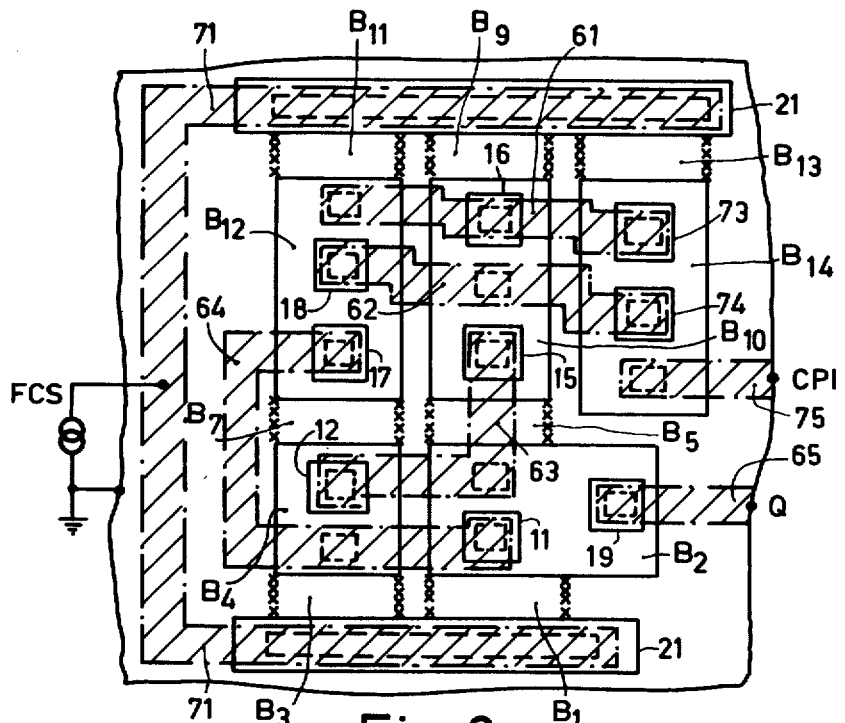
FIG. 9 is a plan view of the semiconductor body portion of a further integrated circuit in accordance with the invention, said part being a master/slave bistable arrangement forming an element of a counter circuit.
Figure 10:
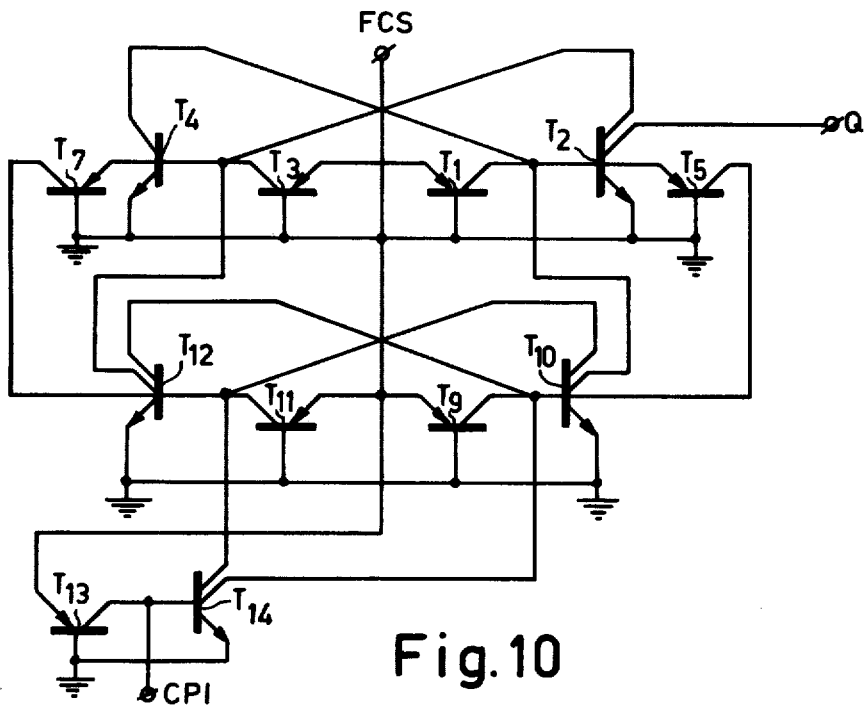
FIG. 10 is a circuit diagram of the part of the integrated circuit shown in FIG. 9.

FIG. 10 is a circuit diagram of the counter element shown in plan view in FIG. 9. The operation of this circuit is similar to that shown in FIG. 7, the main difference residing in that the p-type injector regions are connected to the same, fixed current source and clock pulses are applied via transistors $T_{13}$ and $T_{14}$. The master bistable comprising the transistors $T_1$ to $T_4$, $T_5$, $T_7$ is powered down by diverting the bias currents supplied by the three-layer injection structures 21, $B_9$, $B_{10}$ or 21, $B_{11}$, $B_{12}$, said bias current diversion being through transistor $T_{14}$ via the relevant base contacts to the transistors $T_{10}$ and $T_{12}$. The bias current for transistor $T_{14}$ is supplied by the transistor $T_{13}$ formed by the three-layer injection structure 21, $B_{13}$, $B_{14}$. When this powering down of the master occurs the relevant five-layer injection structure 22, $B_3$, $B_4$, $B_7$, $B_{12}$ or 22, $B_1$, $B_2$, $B_5$, $B_{10}$ is effective in supplying reinjected bias current to the base zone of transistor $T_{12}$ or $T_{10}$ respectively, said bias current being of a considerably smaller magnitude than that supplied by the respective three-layer injector structure 22, $B_3$, $B_4$ or 22, $B_1$, $B_2$ to the base zone of transistor $T_4$ or $T_2$ and serving for preconditioning the state of the master in a similar manner as described with respect to the preceding embodiments. Thus in this embodiment as $T_{14}$ is normally OFF, its bias current supplied by transistor $T_{13}$ being sunk by the clock pulse input CPI in the said OFF condition. When the clock pulse input is such as to no longer be capable of diverting said bias current the transistor $T_{14}$ progressively turns ON thus diverting the bias currents of both $T_{10}$ and $T_{12}$ and thus powering down the master. At the end of the clock pulse period the master, which has been preconditioned with the aid of the said reinjected bias current as described, is powered up again by the transistor $T_{14}$ turning OFF.

It will be evident that as the clock pulse input is a simple connection to the base region of transistor $T_{14}$, in a series of the counter circuits, the clock pulse input can be driven from the output Q of the preceding stage.

Figure 11:
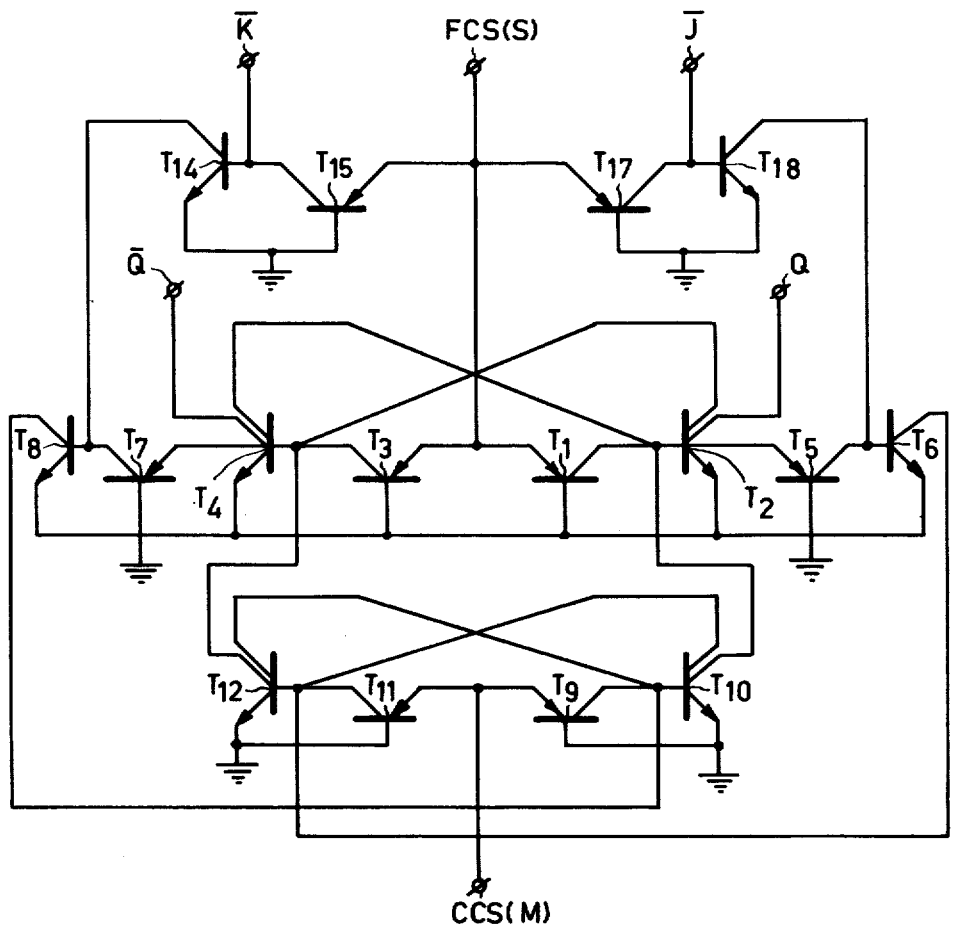
FIG. 11 is a circuit diagram of a further embodiment and in the form of a J-K bistable arrangement.

Referring now to FIG. 11 there is shown the circuit diagram of a J-K bistable. This circuit effectively is a modification of the circuit shown in FIG. 3 and corresponding transistors which perform identical or substantially identical functions are correspondingly indicated with the same reference numerals. The modification resides in the provision of vertical inverse n-p-n transistors $T_{16}$ and $T_{18}$ which have their collector regions respectively connected to the base regions of transistors $T_8$ and $T_6$. The transistors $T_{16}$ and $T_{18}$ are fed with primary bias current by three-layer current injector structures and represented as lateral p-n-p transistors $T_{15}$ and $T_{17}$. The first regions of these three-layer current injection structures are connected to the fixed current source FCS. It will be appreciated that this circuit arrangement with the additional transistors $T_{15}$, $T_{16}$, $T_{17}$, $T_{18}$ may be readily provided in integrated circuit form using the structure described with reference to FIG. 1 with the provision of two further three-layer lateral p-n-p current injection structures and two further inverse vertical n-p-n transistors. The K and J inputs are connected to the base zones of the transistors $T_{16}$ and $T_{18}$ which in the integrated circuit form are formed by the third layers of the further three-layer current injection structures. The K and J inputs are current drains which may be turned ON and OFF by connecting the inputs to earth or not. As in the circuit shown in FIG. 3 the pre-conditioning of the master bistable is effected via one of the transistors $T_6$ or $T_8$ and thus by turning transistor $T_{18}$ or $T_{16}$ ON the pre-conditioning can be overridden so that the J and K inputs can control the next state of the bistable.

If both the K and J inputs are connected to earth the bias currents supplied to $T_{16}$ and $T_{18}$ from the fixed current source FCS are drained away and $T_{16}$ and $T_{18}$ are both OFF. The circuit now reverts back to the operation as described for the circuit shown in FIG. 3.

Figure 12:
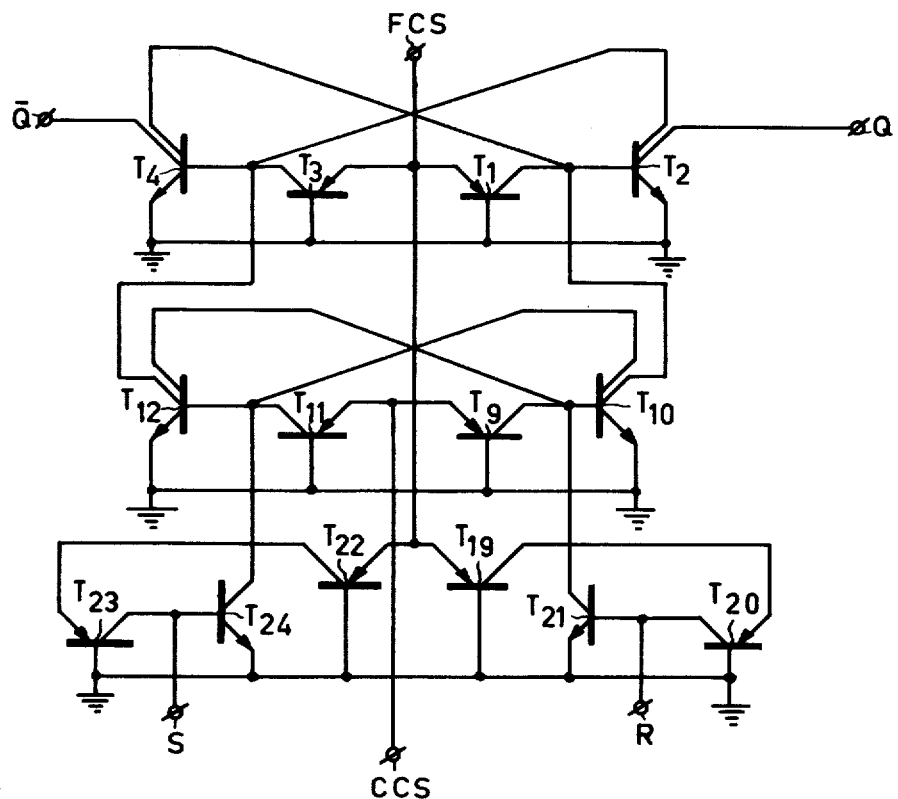
FIG. 12 is a circuit diagram of a further embodiment and in the form of an R-S bistable arrangement.

FIG. 12 shows an R-S bistable in which the transistors present in and associated with the master and slave which correspond to the transistors present in and associated with the master and slave in FIG. 3 are indicated with the same reference numerals.

Further transistors $T_{19}$ to $T_{24}$ are present, the R and S inputs being connected to the bases of transistors $T_{21}$ and $T_{24}$.

The circuit is formed in integrated form using current injection techniques and in a similar manner as described in the preceding embodiments. The multi-layer current injection structures for supplying primary bias current to the cross-coupled pairs of transistors in the master and slave each comprise three successively arranged regions of alternating conductivity type. Thus the inverse vertical n-p-n transistors $T_{10}$, $T_{12}$, $T_2$ and $T_4$ are fed with primary bias current by three-layer current injection structures and represented as lateral p-n-p transistors $T_9$, $T_{11}$, $T_1$ and $T_3$ respectively. The first regions of $T_9$ and $T_{11}$ are connected to a clocked current source CCS and the first regions of $T_1$ and $T_3$ are connected to a fixed current source FCS.

Lateral p-n-p transistors $T_{19}$ and $T_{20}$ and lateral p-n-p transistors $T_{22}$ and $T_{23}$ are formed by a pair of five-layer current injection structures of which the first regions are both connected to the fixed current source FCS. In this manner reinjected bias current, of smaller magnitude than the primary bias current supplied by the three-layer current injection structures, can be supplied to the inverse n-p-n vertical transistors $T_{21}$ and $T_{24}$ of which the base regions are formed by the fifth regions of the five-layer current injection structures, namely the collector zones of $T_{20}$ and $T_{23}$ respectively. The said transistors $T_{21}$ and $T_{24}$ when biassed by said reinjected bias current into the ON condition serve to divert at least a portion of the primary bias current, depending on its level, supplied from the clocked current source CCS to the transistors $T_{10}$ and $T_{12}$ respectively by the three-layer injection structures constituted by the lateral p-n-p transistors $T_9$ and $T_{11}$ respectively.

The R and S inputs are current drains which when ON drain the reinjected bias current from transistors $T_{20}$ and $T_{23}$ and thus cause the transistors $T_{21}$ and $T_{24}$ respectively to be non-conducting.

The operation of the circuit may be illustrated by first assuming that the bistable has been set by S with R ON. When R turns OFF and S is switched ON no reinjected current is drained from $T_{20}$ and therefore $T_{21}$ is ON. Thus a proportion of the bias current supplied by $T_9$ to transistor $T_{10}$ is drawn off via the collector-emitter path of $T_{21}$, the proportion being predetermined by the arrangement of $T_{19}$, $T_{20}$ and $T_{21}$ in respect of amplification factors. During the normal level of the clock pulse source nothing further occurs and the state of the master is thus unaltered.

When the clock pulse source is reduced a higher proportion of the bias current supplied by $T_9$ to $T_{10}$ is drawn away via $T_{21}$ and thus the reinjected bias current supplied to $T_{21}$ is effective in pre-conditioning the state of the master because eventually $T_{10}$ turns OFF, and $T_{12}$ is turned ON when the clock ppulse returns to its normal level at the end of the clock pulse period.

In a similar manner $T_{10}$ can be pre-conditioned into conduction by the set input S being OFF and the reset input R being ON.

In a modification of this arrangement transistors $T_{21}$ and $T_{24}$ are omitted and the reinjected bias currents provided by $T_{19}$, $T_{20}$ and $T_{22}$, $T_{23}$ are supplied, in a similar manner as in the circuit shown in FIG. 7, directly to the base zones of the transistors in the master. In such a case the circuit is such that the collector of $T_{20}$ is connected to the base of $T_{12}$ and the collector of $T_{23}$ is connected to the base of $T_{10}$.

Figure 13:
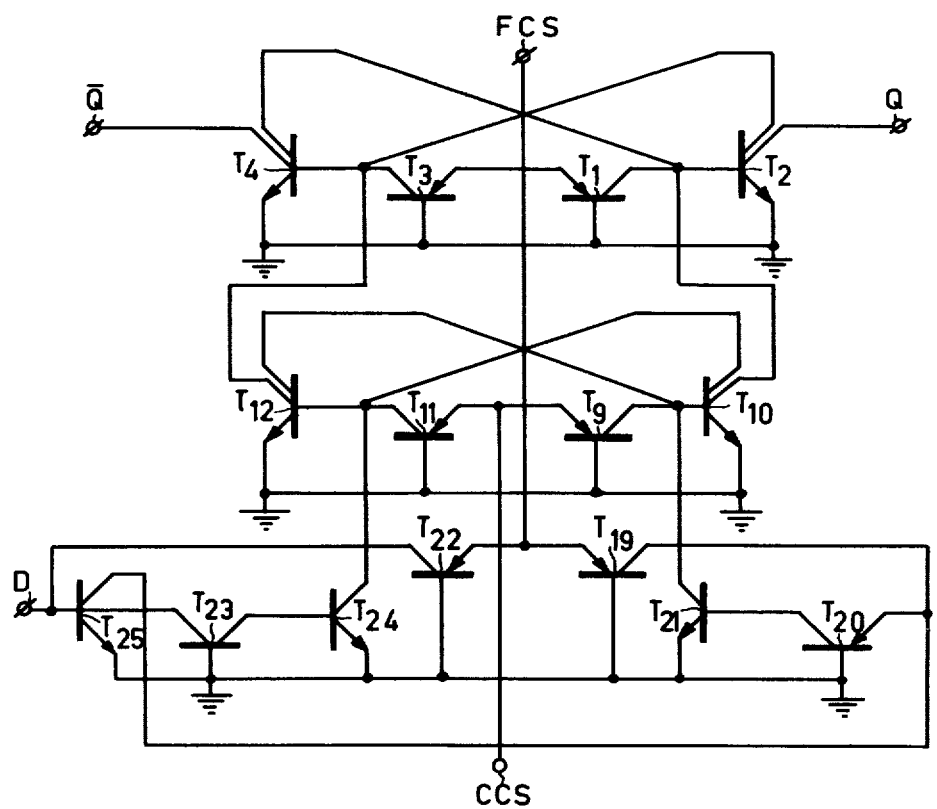
FIG. 13 is a circuit diagram of a further embodiment and in the form of a D-type bistable arrangement.

FIG. 13 shows a D-type bistable and can be considered as a modification of the R-S bistable shown in FIG. 12 and differs in so far as a further inverse n-p-n vertical transistor $T_{25}$ is present to control the supply of reinjected bias current to $T_{21}$ and $T_{24}$. The base of $T_{25}$ is formed by the third region of the five-layer current injection structure comprising transistors $T_{22}$ and $T_{23}$. The collector zone of transistor $T_{25}$ is connected to the third region of the five-layer current injection structure comprising transistors $T_{19}$ and $T_{20}$. The transistor $T_{25}$ is fed with primary bias current from the fixed current source by the transistor $T_{22}$ formed by the first three layers of the relevant five-layer current injection structure. The D-input is connected to the base region of transistor $T_{25}$.

The basic circuit operation is similar to that of the R-S bistable shown in FIG. 12 with the main difference residing in that the transistor $T_{25}$ is used to invert the data input D to give an R and an S input which are thus always complementary. The R and S inputs in FIG. 12 are replaced by the normal and complementary D input.

It will be obvious that many modifications are possible without departing from the scope of the invention. Thus, for example, in principle semiconductor materials other than silicon may be used and if desired the conductivity types of the regions may be reversed. Isolation between groups of elements may be effective by means other than p-n junction isolation diffused separation channels, for example isolation may be achieved using local oxidation of silicon (LOCOS) to form an oxide separation region inset in an epitaxial layer over at least part of the thickness of the epitaxial layer. Furthermore such local oxidation of silicon may be employed to form inset oxide portions to define various regions in the master/slave bistable element, in particular to confine the injected bias current to a desired area.

Although the embodiments described of the master/slave bistable circuit arrangement are all described in terms of integrated circuit devices utilising current injection techniques it is possible to construct the circuit arrangement by other means, for example by using conventional bipolar integrated circuit technology or even discrete circuit elements.

What we claim is:

1. An electrical circuit comprising at least one master/slave bistable arrangement suitable for triggering from a single input of clock pulses, said at least one master/slave bistable arrangement comprising:
   a master bistable comprising a cross-coupled pair of transistors;
   biasing means responsive to a clock pulse source for supplying to said cross-coupled master bistable transistors a primary bias current of normal level when ther is no clock pulse and a bias current of reduced level during a clock pulse;
   a slave bistable comprising a cross-coupled pair of transistors;
   a current source for supplying a fixed biasing current to said cross-coupled slave bistable transistors, said slave bistable assuming a conduction state determined by the conduction state of said master bistable only when said master bistable is biased at a normal level; and
   means responsive to the conduction state of said slave bistable for supplying a secondary bias current to the master bistable of one of the master/slave bistables of said at least one master/slave bistable arrangement to precondition such master bistable to assume a conduction state when returning to a normal bias level that is determined by the conduction state of said slave bistable.

2. An electrical circuit as claimed in 1 and formed as an integrated circuit, said integrated circuit comprising a semiconductor body in which said transistors adjoin one side of the body, a plurality of multi-layer current injection structures adjoining said one side of the body for supplying said primary and fixed bias currents to said cross-coupled pairs of transistors in said master/slave bistable arrangement and for supplying said secondary bias current in the form of reinjected bias current of smaller magnitude than the primary bias current.

3. An integrated circuit as claimed in claim 2, wherein the multi-layer current injection structures which supply primary bias current to the transistors in the slave each comprise five successively arranged regions of alternating conductivity type adjoining the one side of the semiconductor body, the third regions constituting the base zones of the cross-coupled pair of transistors in the slave and the fifth regions constituting the base zones of the transistors to be supplied with reinjected bias current, and in each of said structures the first region forming an injector region having a connection for applying one polarity of a source of bias current and the second region having a connection for the other polarity of said source of bias current whereby the rectifying junction between the first region and the second region can be polarised in the forward direction for the injection of minority carriers into the second region which are received by the third region via the rectifying junction between the second region and the third region, the third region being capable of reinjecting minority charge carriers into the fourth region which are received by the fifth region via the rectifying junction between the fourth region and the fifth region.

4. An integrated circuit as claimed in claim 3, wherein the second and fourth regions are present as a common semiconductor region which constitutes the emitter zones of the cross-coupled pair of transistors in the slave and the emitter zones of the said transistors to be supplied with reinjected bias current, the collector zones of the cross-coupled pair of transistors in the slave being present as surface zones within and of opposite conductivity type to the third regions, and the collector zones of the said transistors to be supplied with reinjected bias current being present as surface zones within and of opposite conductivity type to the fifth regions.

5. An integrated circuit as claimed in claim 2, wherein said transistors to be supplied with reinjected bias current are separate transistors connected in the feedback path between the slave and master, the collector zones of said transistors being cross connected to the base zones of the transistors of the cross-coupled pair of transistors in the master.

6. An integrated circuit as claimed in claim 2, wherein said transistors to be supplied with reinjected bias current are separate transistors connected between the slave of the one master/slave arrangement and a further master of a succeeding similar master/slave arrangement.

7. An integrated circuit as claimed in claim 5, wherein the cross-coupled pair of transistors in the master are supplied with bias current by a pair of current injection structures consisting of three successively arranged regions of alternating conductivity type of which the third regions constitute the base zones of said transistors, the second regions form parts of a common region and constitute the emitter zones of said transistors, the collector zones of said transistors being present as surface zones within and of opposite conductivity type to the third regions, and in each of said three-region structures the first region forming an injector region having a connection for applying one polarity of a source of bias current whereby the rectifying junction between the first region and the second region can be polarised in the forward direction for the injection of minority carriers into the second region which are received by the third region via the rectifying junction between the second region and the third region.

8. An integrated circuit as claimed in claim 7, wherein the master/slave bistable arrangement is constructed for operation with a clock pulse source of bias current applied between the first and second regions of the three-region current injection structures associated with the master and a constant source of bias current applied between the first and second regions of the five-region current injection structures associated with the slave.

9. An integrated circuit as claimed in claim 8, wherein the master/slave bistable arrangement is in the form of a divide-by-two counter element having at least one output connection to the base region of one of the transistors of the cross-coupled pair in the slave.

10. An integrated circuit as claimed in claim 8, wherein a plurality of master/slave bistable arrangements are present and form a shift register in which the connection between succeeding shift register elements in between the collector regions of the said separate transistors to be supplied with reinjected bias current associated with the slave of one arrangement and the base regions of the cross-coupled pair of transistors in the master of the next succeeding arrangement.

11. An integrated circuit as claimed in claim 4, wherein said transistors to be supplied with reinjected bias current are the cross-coupled pair of transistors in the master.

12. An integrated circuit as claimed in claim 2, wherein said transistors to be supplied with reinjected bias current are the cross-coupled pair of transistors in a further master of a preceding or succeeding similar master/slave arrangement present in the circuit.

13. An integrated circuit as claimed in claim 11, wherein the cross-coupled pair of transistors in the master are supplied with primary bias current by a pair of current injection structures consisting of three successively arranged regions of alternating conductivity type of which the third regions which also form the fifth regions of the said five-region current injection structures associated with the slave constitute the base zones of said transistors, the second regions form parts of a common region and constitute the emitter zones of said transistors, the collector zones of said transistors being present as surface zones within and of opposite conductivity type to the third regions, and in each of said three-region structures the first region forming an injector region having a connection for applying one polarity of a source of bias current and the second region having a connection for the other polarity of said source of bias current whereby the rectifying junction between the first region and the second region can be polarised in the forward direction for the injection of minority carriers into the second region which are received by the third region via the rectifying junction between the second region and the third region.

14. An integrated circuit as claimed in claim 13, wherein the master/slave bistable arrangement is constructed for operation with a clock pulse source of bias current applied between the first and second regions of the three-region current injection structures associated with the master and a constant source of bias current applied between the first and second regions of the five-region current injection structures associated with the slave.

15. An integrated circuit as claimed in claim 14, wherein the master/slave bistable arrangement is in the form of a divide-by-two counter element having at least one output connection to the base region of one of the transistors of the cross-coupled pair in the slave.

16. An integrated circuit as claimed in claim 14, wherein a plurality of the master/slave bistable arrangements are present and each forms a shift register element in which in the transistors to be supplied with reinjected bias current associated with the slave of one master/slave arrangement are the cross-coupled pair of transistors of the master of the next succeeding arrangement and the coupling between succeeding shift register elements is via said transistors.

17. An integrated circuit as claimed in claim 7 wherein an auxiliary transistor is present and is fed with bias current by a further current injection structure comprising three successively arranged regions of alternating conductivity type of which the third region forms the base zone of the auxiliary transistor, the second region forms the emitter zone of the auxiliary transistor, said auxiliary transistor comprising two collector zones present as surface zones within and of opposite conductivity type to the third region and respectively connected to the base zones of the transistors in the cross-coupled pair in the master, the first region of the three-region current injection structure forming an injector region, the master/slave bistable arrangement being constructed for operation with a constant source of bias current applied between the first and second regions of the three-layer current injection structures associated with the master and the auxiliary transistor and a constant source of bias current applied between the first and second regions of the five-layer current injection structures associated with the slave, the base zone of the auxiliary transistor having a connection for an input of clock pulses.

18. An integrated circuit as claimed in claim 17, wherein the master/slave bistable arrangement is in the form of a counter element.

19. An integrated circuit as claimed in claim 5, wherein the master/slave bistable arrangement is a J-K bistable, the base zones of the said separate tranistors being connected to the collector zones of further transistors which are fed with primary bias current from the fixed current source via three-layer current injector structures, the base zones of said further transistors being connected to the J and K inputs.

20. An integrated circuit as claimed in claim 2, wherein the multi-layer current injection structures for supplying primary bias current to the cross-coupled pairs of transistors in the master and the slave each comprise three successively arranged regions of alternating conductivity type adjoining the one side of the semiconductor body, the third regions constituting the base zones of said cross-coupled pairs of transistors and in each of said structures the first region forming an injector region having a connection for applying one polarity of a source of bias current and the second region having a connection for the other polarity of said source of bias current, the said connections of the current injection structures associated with the said transistors in the slave being for a fixed current source and the said connections of the current injection structure associated with the said transistors in the master being for a clocked current source, further multi-layer current injector structures being present for supplying reinjected bias current to the cross-coupled pair of transistors, or transistors connected thereto, in the master and each comprising five successively arranged regions of alternating conductivity type adjoining the one side of the semicondutor body of which regions the first region forms an injector region having a connection for applying one polarity of the fixed source of bias current and the second region has a connection for the other polarity of said fixed source of bias current, the fifth regions of the five-layer current injection structures which can receive via the rectifying junction between the fourth region and the fifth region minority charge carriers reinjected by the third region into the fourth region constituting the base zones of the cross-coupled pair of transistors, or of transistors connected thereto, in the master.

21. An integrated circuit as claimed in claim 20, wherein the master/slave bistable arrangement is an R-S bistable and the supply of reinjected bias current by the five-layer current injection structures is controlled by the R and S inputs which are connected to the third regions of these current injection structures.

22. An integrated circuit as claimed in claim 21, wherein the fifth regions of the five-layer current injection structures constitute the base zones of transistors whose collector zones are connected to the base zones of the cross-coupled pair of transistors in the master.

23. An integrated circuit as claimed in claim 20, wherein the master/slave bistable arrangement is a D-type bistable and the supply of reinjected bias current by the five-layer current injection structures is controlled by a further transistor of which the base zone is formed by the third region of one five-layer current injection structure and the collector zone is connected to the third region of the other five-layer current injection structure, said further transistor being fed with bias current via the first three layers of the said one five-layer current injection structure and its base zone being connected to the D input of the arrangement.

* * * * *